(12) United States Patent
Huang et al.

(10) Patent No.: US 7,495,253 B2
(45) Date of Patent: Feb. 24, 2009

(54) ORGANIC THIN-FILM TRANSISTOR AND METHOD FOR MANUFACTURING THE SAME

(75) Inventors: Liang-Ying Huang, Hsin Chu (TW); Jia-Chong Ho, Taipei Hsien (TW); Cheng-Chung Lee, Hsin Chu Hsien (TW); Tarng-Shiang Hu, Hsin Chu (TW); Wen-Kuei Huang, Chia I (TW); Wei-Ling Lin, Nan-Tou (TW); Cheng-Chung Hsieh, Tai Chung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/878,907

(22) Filed: Jul. 27, 2007

(65) Prior Publication Data

US 2008/0035918 A1   Feb. 14, 2008

Related U.S. Application Data

(62) Division of application No. 10/840,637, filed on May 7, 2004, now Pat. No. 7,264,989.

(30) Foreign Application Priority Data

Feb. 13, 2004  (TW) .............................. 93103565 A

(51) Int. Cl.
H01L 51/10  (2006.01)

(52) U.S. Cl. .......... 257/40; 257/E51.005; 257/E51.006; 257/E51.007

(58) Field of Classification Search .................. 257/40, 257/E51.005, E51.006, E51.007
See application file for complete search history.

(56) References Cited

U.S. PATENT DOCUMENTS

| | | | |
|---|---|---|---|
| 6,794,220 B2 | 9/2004 | Hirai et al. |
| 6,913,944 B2 | 7/2005 | Hirai et al. |
| 7,019,327 B2 | 3/2006 | Lee et al. |
| 7,179,697 B2 | 2/2007 | Hu et al. |
| 7,211,463 B2 | 5/2007 | Hu et al. |
| 2003/0160235 A1 | 8/2003 | Hirai |
| 2004/0129937 A1 | 7/2004 | Hirai |
| 2005/0156163 A1 | 7/2005 | Hirai |
| 2005/0194615 A1 | 9/2005 | Huang et al. |
| 2005/0211975 A1 | 9/2005 | Kawasaki et al. |
| 2007/0080346 A1 | 4/2007 | Kim et al. |
| 2007/0114524 A1 | 5/2007 | Oh et al. |

*Primary Examiner*—M. Wilczewski
(74) *Attorney, Agent, or Firm*—Rabin & Berdo, P.C.

(57) ABSTRACT

An organic thin-film transistor and a method for manufacturing the same are described. The method forms a gate layer on a substrate, an insulator layer on the substrate, forming a semiconductor layer on the insulator layer, and a strip for defining a channel length on the semiconductor layer. An electrode layer is screen printed on the semiconductor layer, and a passivation layer is coated on the electrode layer. The organic thin-film transistor manufactured by the method of the invention has a substrate, a gate layer formed on the substrate, an insulator layer formed on the substrate, a semiconductor layer formed on the insulator layer, a strip for defining a channel length formed on the semiconductor layer, an electrode layer screen-printed on the semiconductor layer, and a passivation layer coated on the electrode layer. Thereby, an organic thin-film transistor with a top-contact/bottom-gate structure is obtained.

6 Claims, 4 Drawing Sheets

ORGANIC THIN-FILM TRANSISTOR AND METHOD FOR MANUFACTURING THE SAME

CROSS-REFERENCE TO RELATED APPLICATION

This is a division of U.S. application Ser. No. 10/840,637, filed May 7, 2004 which claimed Priority from Taiwanese application No. 093103565, filed Feb. 13, 2004, the entire disclosure of which is incorporated herein by reference.

BACKGROUND OF THE INVENTION

1. Field of the Invention

The present invention relates to an organic thin-film transistor and a method for manufacturing the same, and particularly, to a method in which a polymer strip is formed on an organic thin-film transistor to define a channel length and then an electrode of the organic thin-film transistor is formed by screen printing to provide a better pattern for the electrode. By using this method, an organic thin-film transistor top-contact/bottom-gate structure can be manufactured.

2. Description of the Related Art

Displays that are thin, power saving, radiationless and full color have become the main stream of the market and are widely used as display devices in various products such as portable personal computers, television sets, electronic handheld games, electronic dictionaries, calculators, car navigation systems and cellular phones. An organic thin-film transistor (OTFT) made of organic materials is developed for applications in electronic products to accelerate the realization of flexible electronic products, such as displays.

According to the OTFT technology, organic materials are provided on a substrate by printing to form a thin-film transistor. Operation of the printing process is relatively simple and it is thus expected that the manufacturing cost thereof will be substantially reduced, compared to the expensive photolithography process. However, the channel length obtained by the present printing process is about several tens of micrometers, which is far from the size of submicrometer range achieved in semiconductor process, and consequently these two technologies are adapted to different applications. To reduce the channel length, in the present invention, a polymer strip is provided to define a channel length on an organic semiconductor layer, and then a polymer organic electrode of the organic thin-film transistor is formed by using screen printing. Therefore, a finer pattern of the polymer organic electrode can be obtained with reduced channel length, and thereby the mobility of electrons and holes is enhanced.

In a process of manufacturing a bottom-contact organic thin-film transistor proposed by Seiki Epson in 2003, a polymer which is not dissolved with an organic electrode is provided to define a channel length, and then the organic electrode is formed by inkjet printing. This method for manufacturing an organic thin-film transistor consumes more time and results in imperfectly straight edges in the electrode.

SUMMARY OF THE INVENTION

In the invention, a polymer strip for defining a channel length is formed on an organic semiconductor device by printing or by photolithography to reduce the channel length and prevent the ink from spreading after screen printing. In addition, it is not necessary to remove the polymer after the formation of an electrode, and thus an outer-most passivation layer can be successively formed to simplify the process.

The object of the invention is to provide a process of manufacturing an organic thin-film transistor by using printing, which offers a substantial improvement.

The features of the invention include:
(1) Reduction of the channel length;
(2) Better semiconductor properties; and
(3) Protection of the organic thin-film transistor.

BRIEF DESCRIPTION OF THE DRAWINGS

Features and advantages of the present invention will be fully understood from the detailed description to follow taken in conjunction with the embodiment as illustrated in the accompanying drawings, which are to be considered in all respects as illustrative and not restrictive, wherein.

DETAILED DESCRIPTION OF PREFERRED EMBODIMENTS

Referring FIGS. 1A to 1F, a step-by-step process of the method for manufacturing an organic thin-film transistor according to the present invention is illustrated and the device is schematically shown to have a top-contact/bottom-gate structure. Each of the drawings depicts one step and will be explained as follows.

Figure 1A:
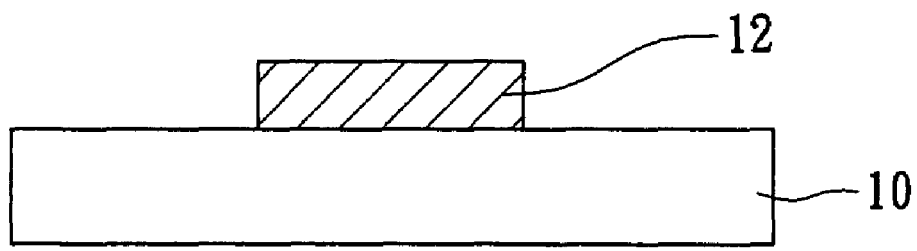
FIG. 1A illustrates the first step of the method for manufacturing an organic thin-film transistor according to the present invention.
Figure 1B:
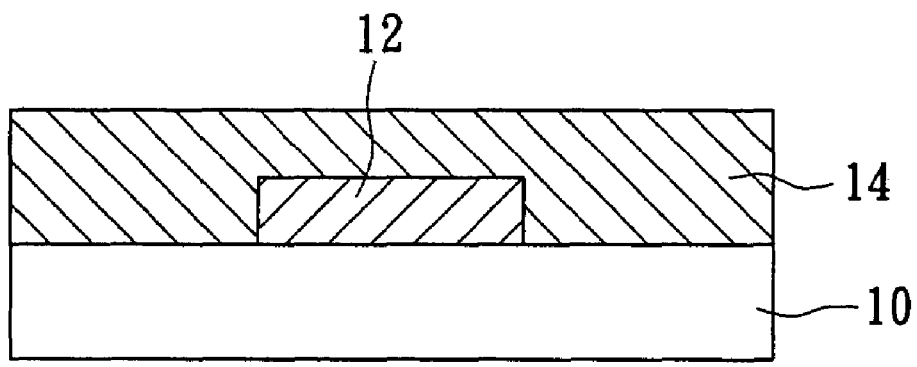
FIG. 1B illustrates the second step of the method for manufacturing an organic thin-film transistor according to the present invention.

First, referring to FIG. 1A, which illustrates the first step of the method for manufacturing the organic thin-film transistor according to the present invention, a gate layer 12 is formed on a substrate 10. Examples of the substrate 10 used in the invention include, but are not limited to, a silicon substrate and a glass substrate. The gate layer 12 will become a gate of the organic thin-film transistor FIG. 1B illustrates the second step of the method for manufacturing the organic thin-film transistor according to the present invention. In the second step, an insulator layer 14 is formed on the substrate 10 and the gate layer 12. In practice, formation of this insulator layer 14 is achieved by deposition or by printing.

Figure 1C:
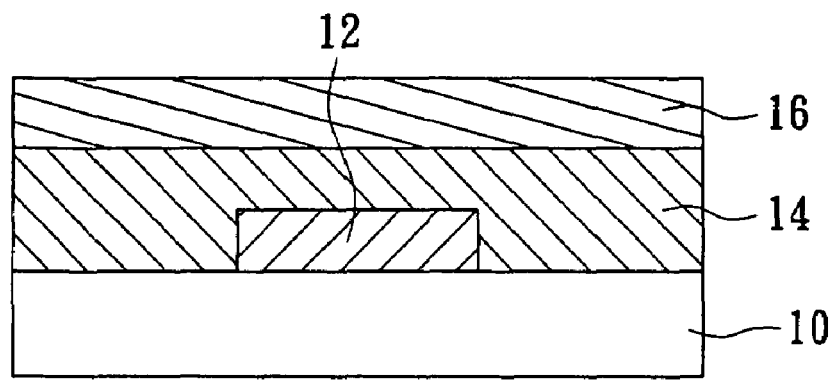
FIG. 1C illustrates the third step of the method for manufacturing an organic thin-film transistor according to the present invention.

FIG. 1C illustrates the third step of the method for manufacturing the organic thin-film transistor according to the present invention. In this step, a semiconductor layer 16 is formed on the insulator layer 14.

Figure 1D:
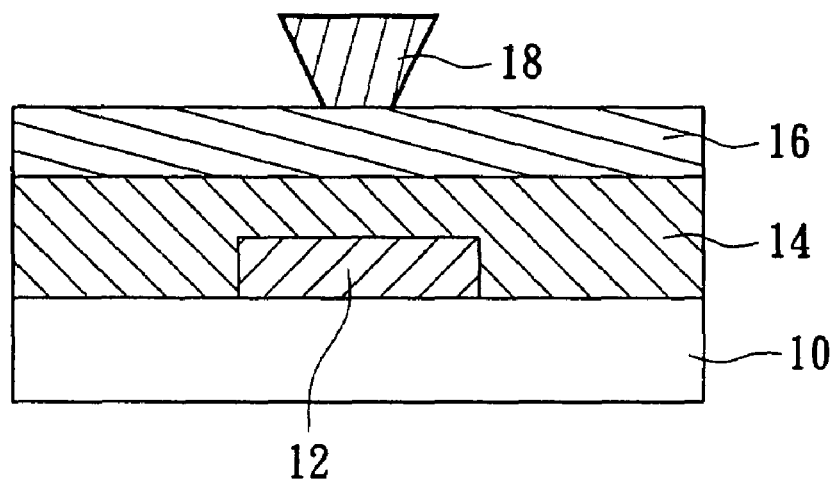
FIG. 1D illustrates the forth step of the method for manufacturing an organic thin-film transistor according to the present invention.

FIG. 1D illustrates the forth step of the method for manufacturing the organic thin-film transistor according to the present invention. In this step, a strip 18 for defining a channel length is formed on the semiconductor layer 16. The strip 18 is formed of a polymer patterned by way of exposure and the patterned polymer of the strip 18 has a height of about one to two times the thickness of the conductive electrode layer. The polymer for forming the strip 18 may be patterned in a strip shape or in a T shape. A preferable material of the strip 18 for defining a channel length is a mild solution. An example of the mild solution is water.

Figure 1E:
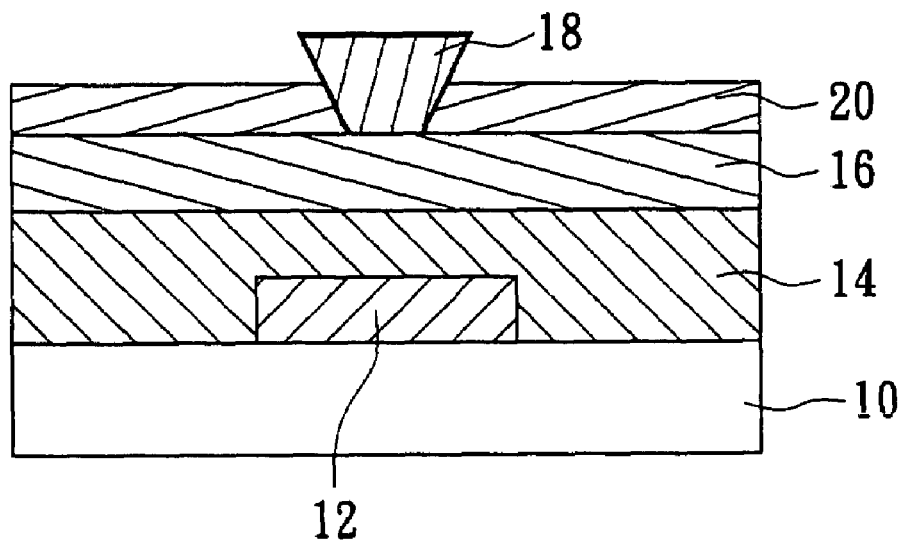
FIG. 1E illustrates the third step of the method for manufacturing an organic thin-film transistor according to the present invention.

FIG. 1E illustrates the fifth step of the method for manufacturing the organic thin-film transistor according to the present invention. In this step, an electrode layer 20 is formed on the semiconductor layer 16. In practice, formation of this electrode layer 20 is achieved by screen printing. The electrode layer 20 may be a conductive paste or a conductive ink made of an organic material, an inorganic material or an organic-inorganic mixed material.

Figure 1F:
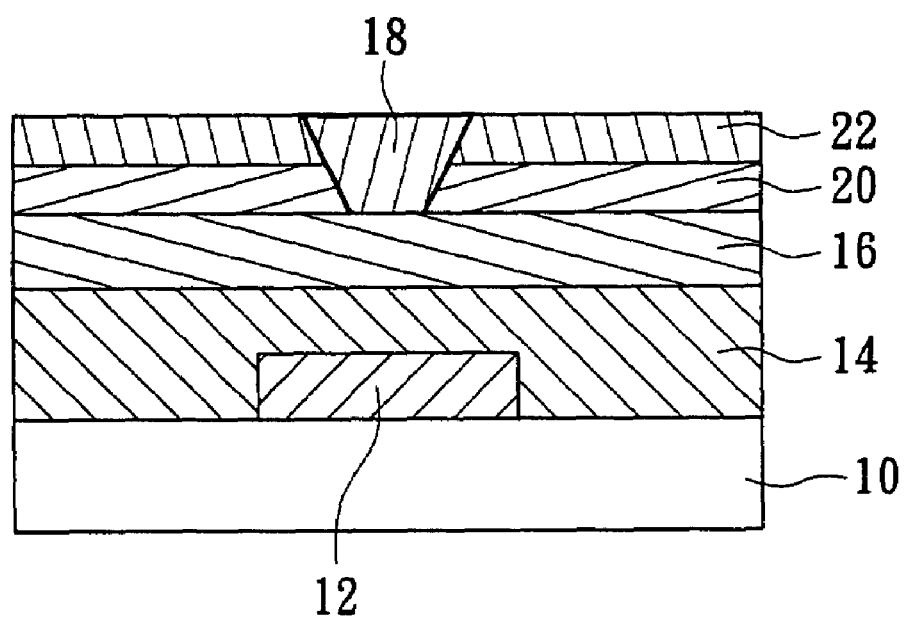
FIG. 1F illustrates the sixth step of the method for manufacturing an organic thin-film transistor and a schematic diagram of a top-contact/bottom-gate structure device according to the present invention.

FIG. 1F illustrates the sixth step of the method for manufacturing the organic thin-film transistor according to the present invention. In this step, a passivation layer 22 is formed between the strip 18 and the electrode layer 20. This figure also shows an organic thin-film transistor with a top-contact/bottom-gate structure.

Figure 2:
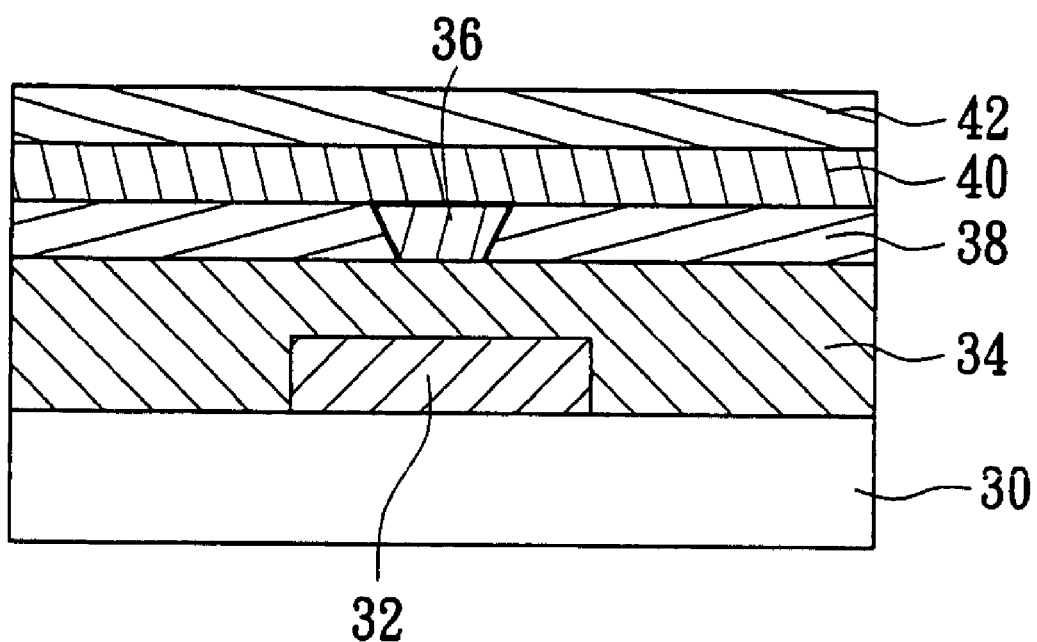
FIG. 2 is a schematic drawing of a bottom-contact/bottom-gate structure device according to the present invention.

Referring to FIG. 2, which schematically shows a bottom-contact/bottom-gate structure device of the invention, the device comprises a substrate 30, a gate layer 32 formed on the substrate 30, an insulator layer 34 formed on the substrate 30, a strip 36 for defining a channel length formed on the insulator layer 34, an electrode layer 38 formed on both sides of the strip 36 by screen printing, a semiconductor layer 40 formed on the strip 36 and the electrode layer 38, and a passivation layer 42 coated on the semiconductor layer 40. Thereby, the organic thin-film transistor with a bottom-contact/bottom-gate structure can be manufactured.

In the above structure, the insulator layer 34 is formed by way of deposition or printing, and the material thereof is not limited to an organic material. The strip 36 for defining a channel length is formed of a polymer patterned by means of exposure and the patterned polymer of the strip 36 has a height of about one to two times the thickness of the conductive electrode layer. The polymer for forming the strip 36 may be patterned to have a strip-shape or a T-shape. A preferable material of the strip 36 for defining a channel length is a mild solution. An example of the mild solution is water. The electrode layer 38 may be a conductive paste or a conductive ink made of an organic material, an inorganic material or an organic-inorganic mixed material.

The present invention also provides a method for manufacturing a bottom-contact/bottom-gate structure device. The method includes the step of forming a gate layer 32 on a substrate 30. The substrate 30 used in this invention is not limited to a silicon substrate or a glass substrate. The gate layer 32 will become a gate of the organic thin-film transistor device.

Next, an insulator layer 34 is formed on the substrate 30 and the gate layer 32. In practice, this insulator layer 34 is formed by deposition or by printing.

Then, a strip 36 for defining a channel length is formed on the insulator layer 34. The strip 36 for defining a channel length is formed of a polymer patterned by means of exposure and the patterned polymer of the strip 36 has a height of about one to two times the thickness of the conductive electrode layer. The polymer for forming the strip 36 may be patterned to have a strip-shape or a T-shape. A preferable material of the strip 36 for defining a channel length is a mild solution. An example of the mild solution is water Then, an electrode layer 38 is screen-printed on the insulator layer 34. In practice, this electrode layer 20 is formed by using screen printing. The electrode layer 38 may be a conductive paste or a conductive ink made of an organic material, an inorganic material or an organic-inorganic mixed material.

Then, a semiconductor layer 40 is formed on the electrode layer 38, and finally a passivation layer 42 is coated on the semiconductor layer 40.

While the present invention has been described with reference to the detailed description and the drawings of the preferred embodiment thereof, it is to be understood that the invention should not be considered as limited thereby. Various modifications and changes will be conceived of by those skilled in the art without departing from the scope of the present invention, which is indicated by the appended claims.

What is claimed is:

1. An organic thin-film transistor, comprising:
   a substrate;
   a gate layer formed on said substrate;
   an insulator layer formed on said substrate by means of deposition or printing, said insulator layer being made of an organic material, an inorganic material or an organic-inorganic mixed material;
   a semiconductor layer formed on said insulator layer;
   a strip for defining a channel length formed on said semiconductor layer;
   an electrode layer formed on said semiconductor layer by screen printing, said electrode layer being a conductive paste or a conductive ink made of an organic material, an inorganic material or an organic-inorganic mixed material, said strip for defining channel length having a height of about one to two times a thickness of said conductive electrode layer; and
   a passivation layer coated on said electrode layer,
   whereby the organic thin-film transistor is formed with a top-contact/bottom-gate structure.

2. The organic thin-film transistor of claim 1, wherein said strip for defining a channel length is formed of a polymer patterned by means of exposure.

3. The organic thin-film transistor of claim 2, wherein said strip for defining a channel length is formed of a polymer patterned in a strip shape or in a T shape.

4. The organic thin-film transistor of claim 2, wherein said strip for defining a channel length is formed of a polymer material of a mild solution.

5. The organic thin-film transistor of claim 4, wherein said mild solution is water.

6. An organic thin-film transistor, comprising:
   a substrate;
   a gate layer formed on said substrate;
   an insulator layer of one of an inorganic material, an organic-inorganic mixed material and an organic material, deposited or printed upon said substrate;
   a semiconductor layer formed on said insulator layer;
   a strip, formed on said semiconductor layer and defining a channel length;
   an electrode layer formed of a conductive paste or a conductive ink, the conductive paste or conductive ink being made of one an organic material, an inorganic material and an organic-inorganic mixed material screen printed upon said semiconductor layer, said strip having a height of about one to two times a thickness of said conductive electrode layer; and
   a passivation layer coating said electrode layer, whereby the organic thin-film transistor has a top-contact/bottom-gate structure.

* * * * *